United States Patent
Bettinger et al.

(10) Patent No.: US 6,199,743 B1
(45) Date of Patent: Mar. 13, 2001

(54) APPARATUSES FOR FORMING WIRE BONDS FROM CIRCUITRY ON A SUBSTRATE TO A SEMICONDUCTOR CHIP, AND METHODS OF FORMING SEMICONDUCTOR CHIP ASSEMBLIES

(75) Inventors: Michael Bettinger, Eagle; Ronald W. Ellis; Tracy Reynolds, both of Boise, all of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/378,552

(22) Filed: Aug. 19, 1999

(51) Int. Cl.[7] .............................. B23K 1/06; B21D 43/02; B21D 43/04
(52) U.S. Cl. .................................. 228/110.1; 228/123.1; 228/173.2; 228/173.1
(58) Field of Search ............................... 228/110.1, 120, 228/122.1, 123.1, 141.1, 173.1, 173.2, 121.1

(56) References Cited

U.S. PATENT DOCUMENTS

| | | | |
|---|---|---|---|
| 3,347,442 | * 10/1967 | Reber | 228/3 |
| 3,934,783 | * 1/1976 | Larrison | 228/110 |
| 5,024,367 | * 6/1991 | Terakado et al. | 228/111 |
| 5,153,981 | * 10/1992 | Soto | 29/701 |
| 5,277,356 | * 1/1994 | Kawauchi | 228/111 |
| 5,322,207 | * 6/1994 | Fogal et al. | 228/180.5 |
| 5,674,785 | * 10/1997 | Akram et al. | 437/217 |
| 6,049,129 | * 4/2000 | Yew et al. | 257/737 |

\* cited by examiner

*Primary Examiner*—Patrick Ryan
*Assistant Examiner*—Jonathan Johnson
(74) *Attorney, Agent, or Firm*—Dorsey & Whitney LLP

(57) ABSTRACT

The invention encompasses a method of forming a semiconductor chip assembly. A substrate is provided. Such substrate has a pair of opposing surfaces and circuitry formed on one of the opposing surfaces. A semiconductor chip is joined to the substrate. The semiconductor chip has bonding regions thereon. A plurality of wires join to the circuitry and extend over the bonding regions of the semiconductor chip. The wires are pressed down to about the bonding regions of the semiconductor chip with a tool. The tool is lifted from the wires, and subsequently the wires are adhered to the bonding regions of the semiconductor chip. The invention also encompasses an apparatus for forming wire bonds from circuitry on a substrate to a semiconductor chip joined to the substrate. Such apparatus comprises a support for supporting the substrate and the semiconductor chip. The apparatus further comprises a pressing tool movably mounted relative to the substrate, and which has a deflecting surface configured to press the wires into a slit of the substrate when the pressing tool is moved toward the substrate. The deflecting surface is substantially planar, and has a sufficient length to extend within a predominate portion of the slit.

6 Claims, 6 Drawing Sheets

APPARATUSES FOR FORMING WIRE BONDS FROM CIRCUITRY ON A SUBSTRATE TO A SEMICONDUCTOR CHIP, AND METHODS OF FORMING SEMICONDUCTOR CHIP ASSEMBLIES

TECHNICAL FIELD

The invention pertains to methods and apparatuses for forming semiconductor chip assemblies. In particular aspects, the invention pertains to methods and apparatuses for forming wire bonds in board-on-chip packages.

BACKGROUND OF THE INVENTION

A prior art method of forming a board-on-chip package (which can be generally referred to as a die package) is described with reference to FIGS. 1–5. Referring first to FIG. 1, such illustrates a fragment of an assembly 10 comprising an insulative material substrate 12. Substrate 12 can comprise, for example, a circuit board.

Substrate 12 comprises a top surface 13 and slits 18 extending therethrough. Circuitry 16 is formed on top of surface 13. Circuitry 16 and slits 18 form repeating patterns across top surface 13. The repeating patterns define separate units 19, 21 and 23, each of which ultimately forms a separate board-on-chip package.

Referring to FIGS. 2–4, an enlarged segment of substrate 12, corresponding to unit 21, is shown in three different views. FIG. 2 is a top view similar to the view of FIG. 1, FIG. 3 is view along the line 3—3 of FIG. 2, and FIG. 4 is a view along the line 4—4 of FIG. 3. Substrate 12 is inverted in the view of FIG. 3 relative to the view of FIGS. 1 and 2. Accordingly, surface 13 (referred to as a top surface in referring to FIGS. 1 and 2) is a bottom surface in the view of FIG. 3. In referring to FIG. 3, surface 13 will be referred to as a first surface.

Substrate 12 comprises a second surface 15 in opposing relation relative to first surface 13. A semiconductive material-comprising chip (or die) 14 is adhered to surface 15 via a pair of adhesive strips 20. Strips 20 can comprise, for example, tape having a pair of opposing surfaces 22 and 24, with adhesive being provided on both of such opposing surfaces. Strips 20 typically comprise insulative material. Wire bonds 28 (only some of which are labeled in FIG. 2) extend from circuitry 16 and through slit 18 to electrically connect circuitry 16 to bonding pads 25 (only some of which are labeled in FIG. 2) associated with chip 14, and to accordingly electrically connect circuitry 16 with circuitry (not shown) comprised by chip 14. Chip 14 comprises a surface 17 which faces surface 15 of substrate 12. The bonding pads are on surface 17. (The wire bonds and bonding pads are not shown in FIG. 4 for purposes of clarity in the illustration.)

FIG. 5 illustrates further processing of the assembly 10. Specifically, FIG. 5 illustrates units 19 and 21 of FIG. 1 after a first encapsulant 40 is provided over wire bonds 28, and a second encapsulant 42 is provided over chips 14 associated with units 19 and 21. First and second encapsulants 40 and 42 can comprise the same material and typically comprise an insulative material, such as, for example, cured epoxy.

Conductive balls 31 are formed over portions of circuitry 16 (shown in FIGS. 1 and 2) to form a ball grid array over circuitry 16. Such array can subsequently be utilized to form a plurality of interconnects from circuitry 16 to other circuitry (not shown). Conductive balls 31 can be formed of, for example, tin, copper or gold.

Substrate 12 is subjected to a singulation process which separates units 19 and 21 from one another, and thus forms individual board-on-chip packages from units 19 and 21. The singulation process can include, for example, cutting through encapsulant 42 and substrate 12.

Difficulties can occur in the formation of the wire bonds associated with a board-chip-package. Among the methods commonly utilized for forming such wire bonds are a TESSERA™ process and a so-called tab bonding process. In either of such processes, the wires utilized for wire-bonding initially have one end bonded to circuitry 16. The wires are provided to extend at least partially across slit 18 so that a second end (which is not bonded to circuitry 16) extends over or past slit 18. A rod is then utilized to individually and sequentially push each wire into slit 18 and to hold the wire against chip 14 during an ultrasonic welding process. The ultrasonic welding individually and sequentially adheres the second end of each wire to a bonding pad 25.

It would be desirable to develop alternative methods for forming wire bonds.

SUMMARY OF THE INVENTION

In one aspect, the invention encompasses a method of forming a semiconductor chip assembly. A substrate is provided. Such substrate has a pair of opposing surfaces and circuitry formed on one of the opposing surfaces. A semiconductor chip is joined to the substrate. The semiconductor chip has bonding regions thereon. A plurality of wires join to the circuitry and extend over the bonding regions of the semiconductor chip. The wires are pressed down to about the bonding regions of the semiconductor chip with a tool. The tool is lifted from the wires, and subsequently the wires are adhered to the bonding regions of the semiconductor chip.

In another aspect, the invention encompasses an apparatus for forming wire bonds from circuitry on a substrate to a semiconductor chip joined to the substrate. Such apparatus comprises a support for supporting the substrate and the semiconductor chip. The apparatus further comprises a pressing tool movably mounted relative to the substrate, and which has a deflecting surface configured to press the wires into a slit of the substrate when the pressing tool is moved toward the substrate. The deflecting surface is substantially planar, and has a sufficient length to extend within a predominate portion of the slit.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
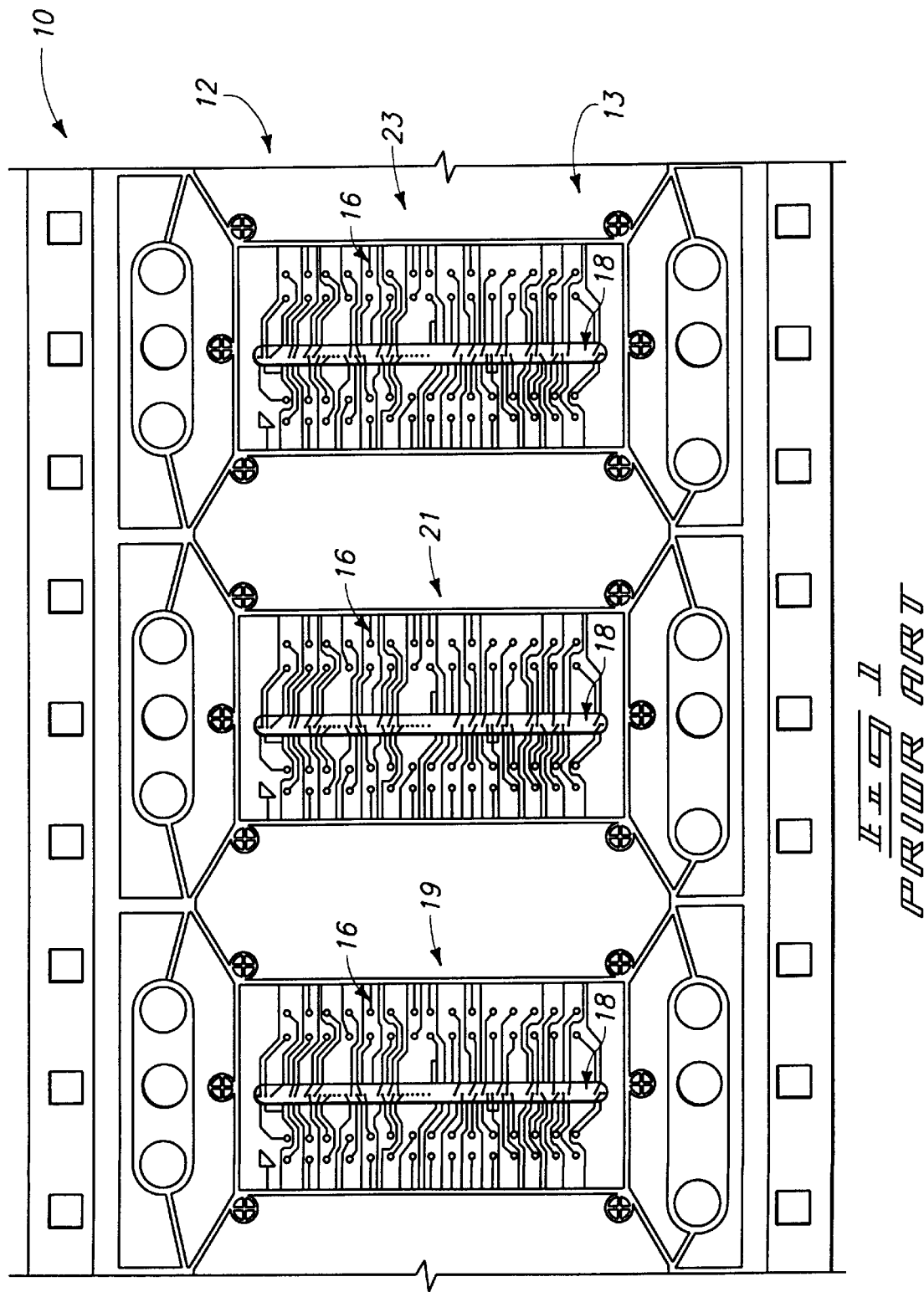
FIG. 1 is a diagrammatic, fragmentary view of a prior art semiconductor assembly at a preliminary step of a die package forming process.
Figure 2:
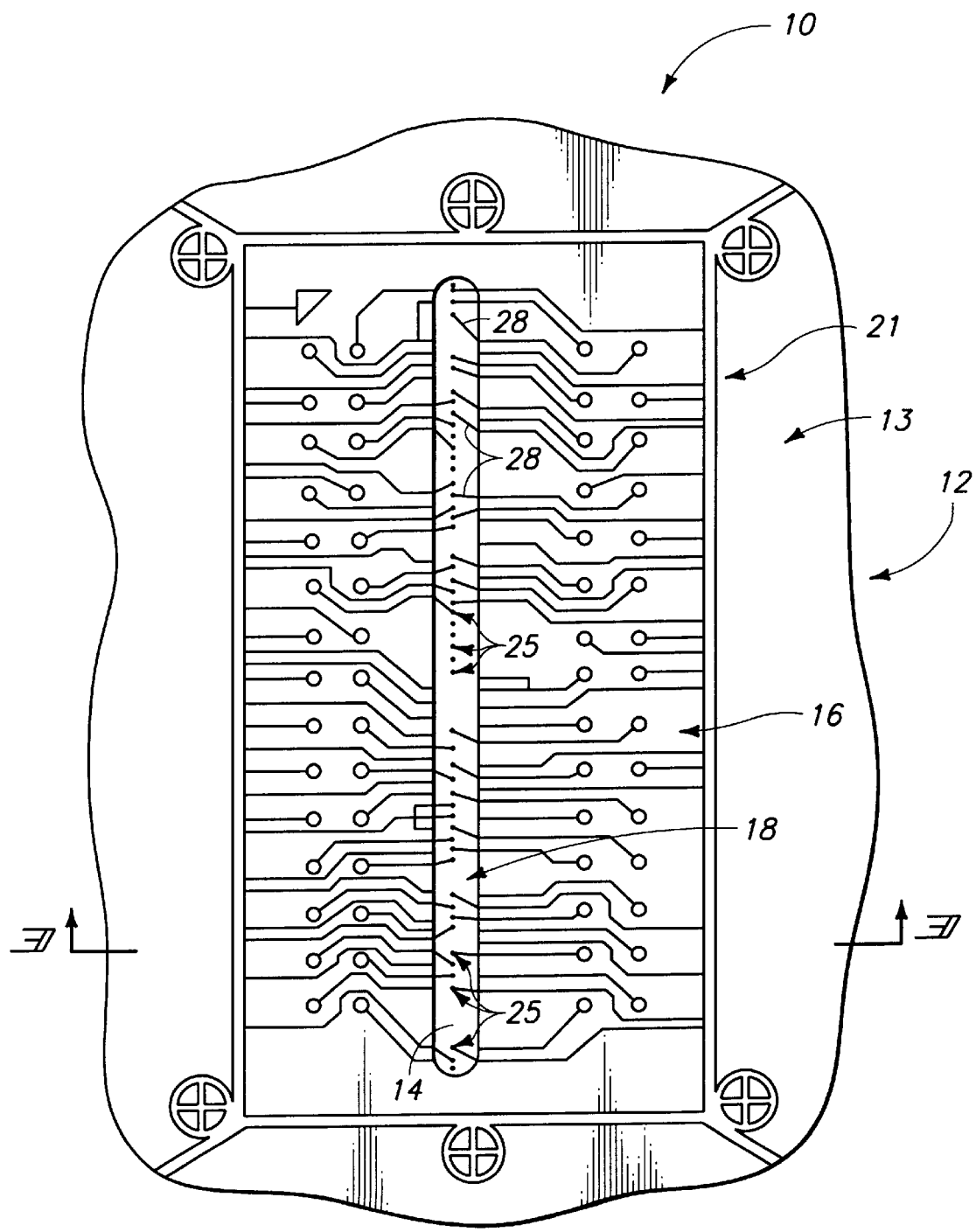
FIG. 2 is an expanded view of a portion of the FIG. 1 assembly.
Figure 3:
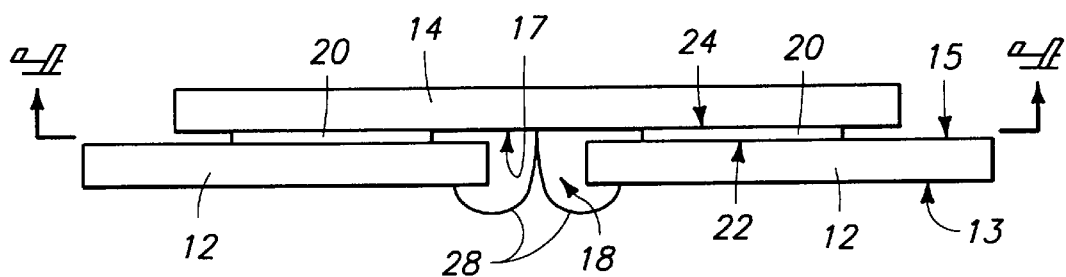
FIG. 3 is a cross-sectional view along the line 3—3 of FIG. 2.
Figure 4:
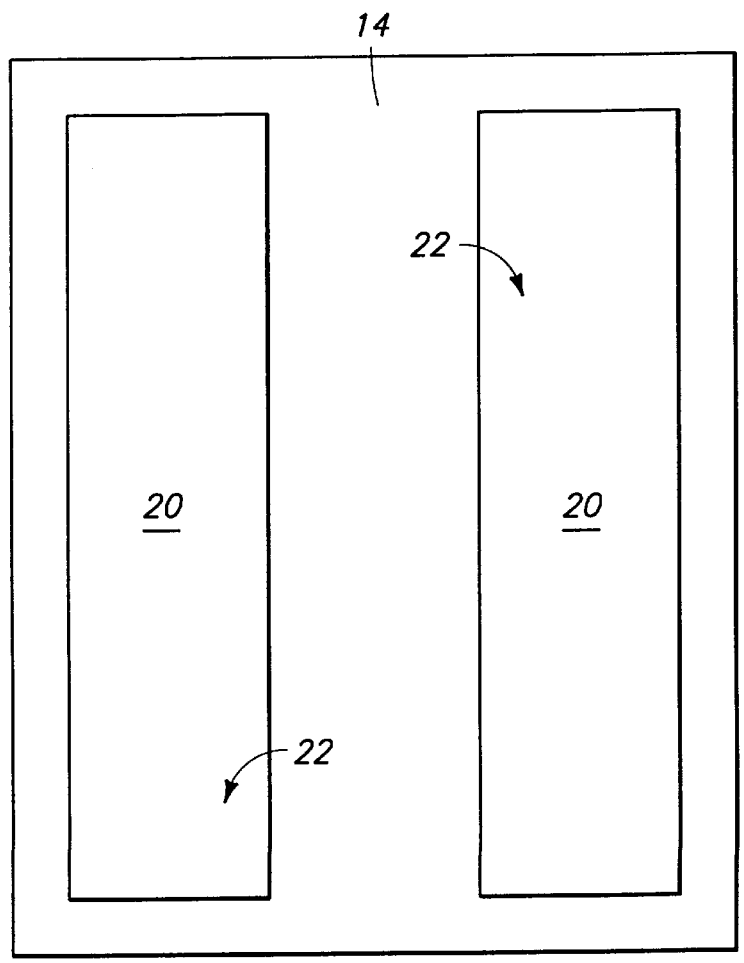
FIG. 4 is a cross-sectional view along the line 4—4 of FIG. 3.
Figure 5:
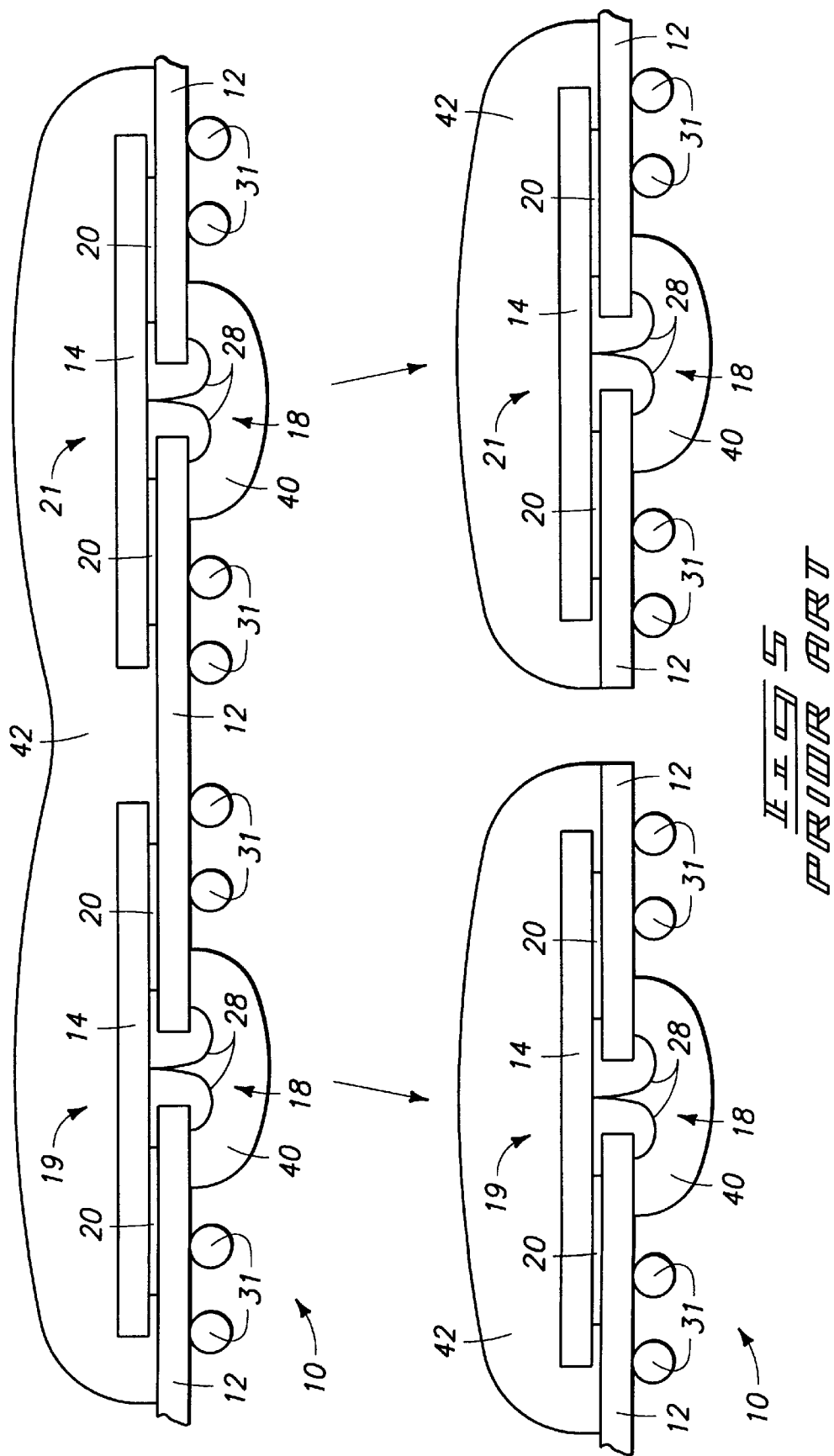
FIG. 5 is a view of a portion of the FIG. 1 assembly shown being subjected to prior art processing subsequent to that of FIGS. 1–4.
Figure 6:
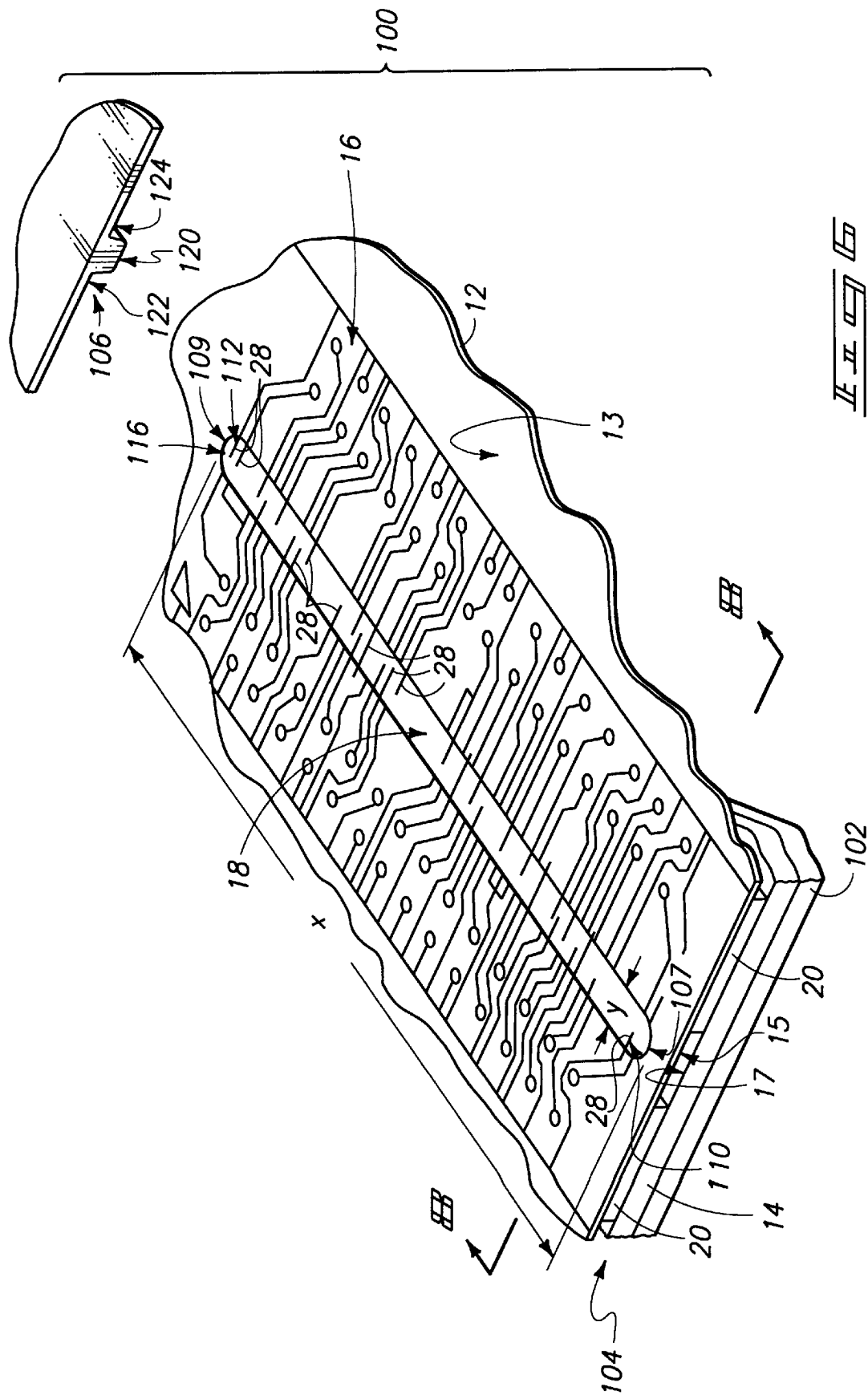
FIG. 6 is a diagrammatic, fragmentary, perspective view of an apparatus of the present invention being utilized to process a semiconductor chip assembly.

The invention encompasses a new apparatus and method for forming wire bonds. Referring to FIG. 6, an apparatus 100 of the present invention is shown in fragmentary, perspective view. Apparatus 100 comprises a support 102 configured to support a semiconductor chip assembly 104, and a tool 106 configured to displace wires associated with semiconductor chip assembly 104 to form wire bonds.

In the shown embodiment, semiconductor chip assembly 104 comprises a portion of a prior art board-on-chip assembly of the type described in the Background section of this disclosure with reference to FIGS. 1–5. Accordingly, assembly 104 comprises a substrate 12, a semiconductive material chip 14, and adhesive strips 20 joining chip 14 to substrate 12. Further, substrate 12 comprises an upper surface 13 having circuitry 16 formed thereon and a lower surface 15 to which semiconductive material chip 14 is joined. Chip 14 has an upper surface 17 having bonding pads 25 thereon (bonding pads 25 are not shown in FIG. 6 for purposes of clarity in the illustration, but are shown in, for example, FIG. 2). Bonding pads 25 typically comprise a metal, such as, for example, aluminum which can be ultrasonically welded to bonding wires. Bonding pads 25 can be generically referred to herein as bonding regions to indicate that the areas 25 simply constitute regions to which wire bonds will be connected with chip 14, and do not necessarily comprise the structures associated with bonding "pads".

A slit 18 extends through substrate 12, and specifically extends from upper surface 13 of substrate 12 to lower surface 15 of substrate 12. The bonding pads 25 (not shown in FIG. 6) are exposed through slit 18. A plurality of bonding wires 28 (only some of which are labeled) are electrically connected with circuitry 16 and extend at least partially over slit 18. The electrical connection of wires 28 to circuitry 16 preferably comprises a form of adhesion of wires 28 to circuitry 16, such that one end of each wire is bonded to circuitry 16, and accordingly adhered over upper surface 13 of substrate 12. Each wire 28 has a second end which is not fixed, with such second end being configured to be bonded with a pad 25. In the shown embodiment, some of wires 28 extend entirely across slit 18, and some of wires 28 extend only partially across slit 18. It is to be understood that in particular embodiments of the invention, all of wires 28 can extend entirely across slit 18, or none of wires 28 can extend entirely across slit 18.

Slit 18 is rectangular in shape, and comprises a length "x" and a width "y". Further, slit 18 comprises a pair of ends 107 and 109 spaced from one another by length "x".

One of wires 28 is labeled as a first wire 110, and comprises the wire closest to end 107. Another of wires 28 is labeled as a second wire 112 and constitutes the wire closest to end 109. First wire 110 is spaced from end 107 by a gap 114, and second wire 112 is spaced from end 109 by a gap 116.

Figure 7:
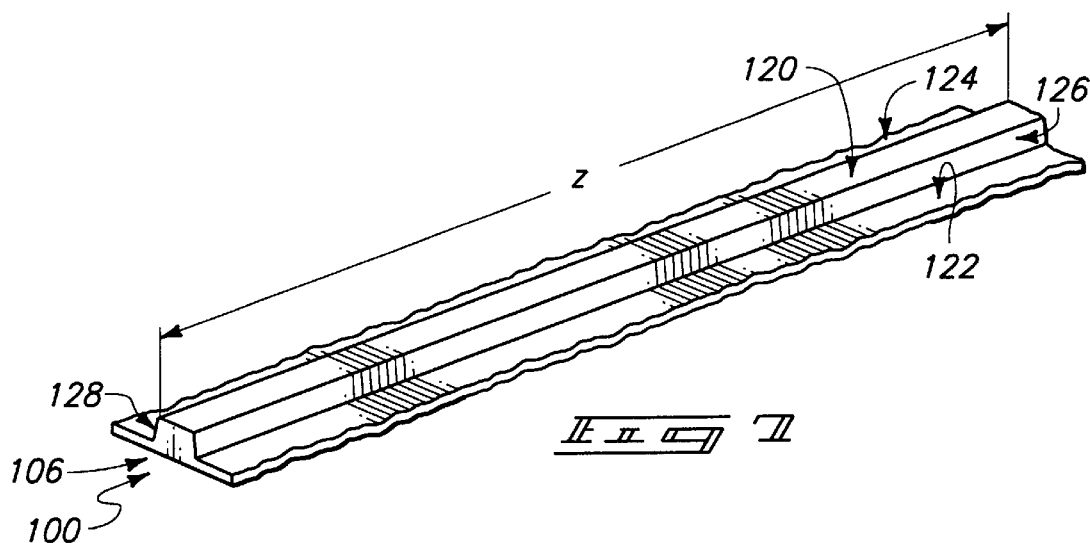
FIG. 7 is a diagrammatic, top view of a tool encompassed by an apparatus of the present invention.

Tool 106 comprises a deflecting surface 120 configured to extend within gap 18 and push wires 28 down to about bonding pads 25 (with the term "about" indicating that the wires can be pressed all the way to contact bonding pads 25, or can be pressed into slit 18 to a distance which leaves wires 28 elevated above pads 25). Tool 106 is shown in FIG. 7 in a view which is upside down from that of FIG. 6, and which more clearly shows deflecting surface 120. FIG. 7 further shows that deflecting surface 120 is substantially planar, and that tool 106 comprises other substantially planar surfaces 122 and 124 which are connected to deflecting surface 120 through sidewalls 126 and 128, respectively. Planar surfaces 122 and 124 are preferably configured to rest upon surface 13 (or, more specifically, circuitry over upper surface 13) when deflecting surface 120 is inserted within slit 18. In the shown preferred embodiment, sidewalls 126 and 128 extend non-perpendicularly relative to planar surfaces 120, 122 and 124. Such non-perpendicular extension of sidewalls 126 and 128 relative to the planar surfaces avoids formation of a "tight corner" in wires 28 when the wires are deflected into slit 18 by tool 106. The term "tight corner" being utilized to refer to a corner which is less than or equal to about 90°. Tight corners can be undesirable, in that they can reduce current flow through a wire, and can also weaken the wire to cause breakage of the wire.

Deflecting surface 120 has a length "z" which is preferably about the same length as the length "x" of slit 18. Length "z" is preferably least long enough to extend over a predominate portion of slit 18, and more preferably is long enough to extend from first wire 110 to second wire 112, such that the entire plurality of wires 28 are deflected simultaneously by tool 106 when the tool is moved into slit 18. In particular embodiments, length "z" is long enough to extend past both of wires 110 and 112 (i.e., into gaps 114 and 116) to compensate for minor misalignment of surface 120 relative to slit 18.

It is noted that the views of FIGS. 6 and 7 show apparatus 100 as being a fragment. In preferred embodiments, apparatus 100 is utilized before singulation of individual chip packages from a substrate (with the singulation being described with reference to prior art FIG. 5). Apparatus 100 preferably comprises a repeating number of tools 106 such that there is a tool corresponding to each of the slits 18 repeated across a substrate 12 (with the repeated slits described with reference to prior art FIG. 1) such that an entire substrate panel can be simultaneously processed by moving a plurality of tools 106 into the plurality of slits 18. In alternative embodiments, apparatus 100 can comprise less tools 106 than there are slits 18 in a substrate, and the tools 106 can be moved stepwise from one slit 18 to another across a substrate panel.

Figure 8:
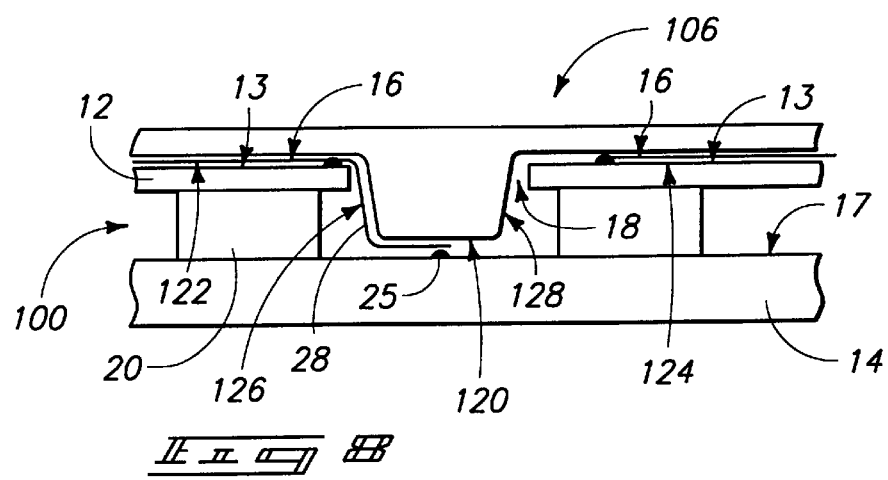
FIG. 8 is a cross-sectional, fragmentary view of the FIG. 6 apparatus shown at a processing step subsequent to that of FIG. 6, and shown along the line 8—8 of FIG. 6.

Referring to FIG. 8, apparatus 100 is shown at a processing step subsequent to that of FIG. 6, and in a cross-sectional view along line 8—8 of FIG. 6. Tool 106 has now been moved into slit 18 such that deflecting surface 120 is pushing an end of wire 28 onto a surface of chip 14, and specifically onto a bonding pad 25. (A gap is shown between tool 106 and wire 28 for clarity of illustration of wire 28. In practice, tool 106 would be pressed against wire 28.) Although only one wire 28 is shown being deflected, it is to be understood that preferably all of the wires 28 of FIG. 6 are being simultaneously deflected by insertion of tool 106 into slit 18. FIG. 8 also shows that planar surfaces 122 and 124 are configured to rest on circuitry 16 as deflecting surface 120 deflects wires 28 against pads 25. Surfaces 122 and 124 can accordingly aid in holding the bonded ends of wires 28 onto circuitry 16 during the deflection of wire 28 by deflecting surface 120. FIG. 8 also shows that sidewalls 126 and 128 extend non-perpendicularly relative to the substantially planar surface 17 of chip 14.

Figure 9:
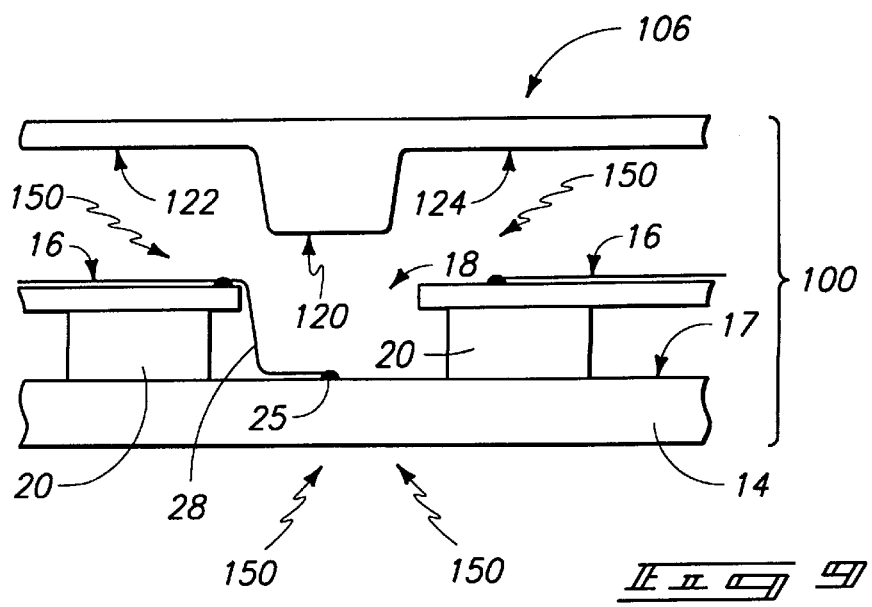
FIG. 9 is a view of the FIG. 6 apparatus, shown along line 8—8, and shown at a processing step subsequent to that illustrated in FIG. 8.

Referring to FIG. 9, apparatus 100 is shown from the same view as FIG. 8, and at a processing step subsequent to that of FIG. 8. Specifically, tool 106 has been lifted to remove deflecting surface 120 from within slit 18, and wire 28 is adhered to pad 25. In the shown embodiment, ultrasonic energy 150 is provided to adhere wire 28 to pad 25. In particular embodiments, pad 25 can comprise, for example, an aluminum surface; wire 28 can comprise, for example, gold or copper; and the ultrasonic energy can effectively diffuse pad 25 and wire 28 to weld wire 28 to pad 25.

In preferred embodiments, tool 106 is entirely removed from within slit 18 prior to provision of ultrasonic energy to weld wire 28 to pad 25. Such is in contrast to, for example, the Tessera™ process (described above with reference to prior art) wherein a wire is held in place during provision of ultrasonic energy. Also, the invention differs from both the tab bonding and Tessera™ processes in that most, and preferably all, of the wire bonds extending across a slit are simultaneously deflected in a method of the present invention. In contrast, in the Tessera™ and tab bonding processes, the wires are deflected sequentially into a slit.

It is noted that although the invention is described above with reference to board-on-chip semiconductor fabrication processes, the invention can have application to other processes wherein wires are to be deflected, as well as to other applications wherein wires are to be utilized for wire bonding a semiconductor chip to circuitry. It is further noted that although ultrasonic welding is disclosed as a method of bonding wire 28 to pad 25, the invention can be utilized with other methods of adhering a wire to a semiconductor substrate, including, for example, the utilization of a conductive epoxy.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a semiconductor chip assembly, comprising:

providing a substrate having circuitry formed thereover and a slit extending therethrough; the slit having a length and a width, and having a pair of ends spaced from one another by the length, the pair of ends being a first end and a second end;

joining a semiconductor chip to the substrate, the semiconductor chip being beneath the substrate and having an upper surface facing the substrate, the semiconductor chip having bonding regions associated with its upper surface;

forming a plurality of wires joined to the circuitry and extending at least partially across the width of the slit, a first wire being closer to the first end than any of the other wires of the plurality of wires, and a second wire being closer to the second end than any of the other wires of the plurality of wires;

pressing the plurality of wires into the slit with a tool configured to press the wires down to about the upper surface of the semiconductor chip, the tool extending from the first wire to the second wire and pressing the first and second wires simultaneously into the slit; and after pressing the wires into the slit, adhering the wires to the bonding regions associated with the upper surface of the semiconductor chip.

2. The method of claim 1 wherein the adhering the wires comprises ultrasonically welding the wires to the bonding regions.

3. The method of claim 1 further comprising:

lifting the tool from the wires; and wherein the adhering the wires occurs after lifting the tool and with the tool no longer pressing the wires down to about the upper surface of the semiconductor chip.

4. The method of claim 1 wherein at least some of the wires extend entirely across the width of the slit prior to the pressing.

5. The method of claim 1 wherein a first gap is between the first wire and the first end, wherein a second gap is between the second wire and the second end, and wherein the tool extends into at least one of the first and second gaps.

6. The method of claim 5 wherein the tool extends into both of the first and second gaps.

* * * * *